(12) United States Patent
Miyake et al.

(10) Patent No.: US 9,343,384 B2
(45) Date of Patent: May 17, 2016

(54) SEMICONDUCTOR DEVICE

(71) Applicant: KABUSHIKI KAISHA TOSHIBA, Minato-ku, Tokyo (JP)

(72) Inventors: Eitaro Miyake, Kawasaki Kanagawa (JP); Hideaki Kitazawa, Kamakura Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/645,283

(22) Filed: Mar. 11, 2015

(65) Prior Publication Data
US 2016/0079134 A1 Mar. 17, 2016

(30) Foreign Application Priority Data

Sep. 16, 2014 (JP) .................. 2014-187951

(51) Int. Cl.
*H01L 23/32* (2006.01)
*H01L 23/08* (2006.01)
*H01L 23/13* (2006.01)
*H01L 23/051* (2006.01)
*H01L 23/00* (2006.01)
*H01L 29/744* (2006.01)

(52) U.S. Cl.
CPC ............. *H01L 23/08* (2013.01); *H01L 23/051* (2013.01); *H01L 23/13* (2013.01); *H01L 23/32* (2013.01); *H01L 23/564* (2013.01); *H01L 29/744* (2013.01)

(58) Field of Classification Search
CPC ... H01L 23/043; H01L 23/564; H01L 23/051; H01L 23/49838; H01L 23/43; H01L 23/08; H01L 25/115; H01L 29/7393; H01L 29/744; H01L 21/52

USPC .......................................................... 257/683
See application file for complete search history.

(56) References Cited

U.S. PATENT DOCUMENTS

| 4,958,215 A | * | 9/1990 | Kojima | .................. | H01L 23/051 |
| | | | | | 257/182 |
| 5,121,189 A | * | 6/1992 | Niwayama | ............ | H01L 23/051 |
| | | | | | 257/688 |

(Continued)

FOREIGN PATENT DOCUMENTS

| JP | 07037914 A | 2/1995 |
| JP | 3535341 B2 | 6/2004 |

(Continued)

*Primary Examiner* — Nathan Ha
(74) *Attorney, Agent, or Firm* — Holtz, Holtz & Volek PC

(57) ABSTRACT

A semiconductor device includes a semiconductor chip comprising a first and second terminal surfaces. An insulator surrounds an outer circumference of a side surface of the chip. A reinforcing-member is arranged between the side surface of the chip and an inner side surface of the insulator and surrounds the outer circumference of the side surface of the chip. A first and second holders hold the reinforcing-member therebetween at a top and bottom surfaces of the reinforcing-member. The first and second holders comprise protrusions facing an inner wall surface of the reinforcing-member, and the when φ1in represents an inner-diameter of parts of the reinforcing-member opposing to the protrusions, φ1out represents an outer-diameter of the reinforcing-member, φ2 represents an outer-diameter of the protrusion of either the first or the second holder, and φ3 represents an inner diameter of the insulator, the following Expression 1 is satisfied φ1in–φ2<φ1out.

18 Claims, 6 Drawing Sheets

(56) References Cited

U.S. PATENT DOCUMENTS

| | | | | |
|---|---|---|---|---|
| 5,278,434 A * | 1/1994 | Niwayama | H01L 23/051 | 257/181 |
| 5,543,363 A * | 8/1996 | Tokunoh | H01L 23/051 | 257/688 |
| 5,621,237 A * | 4/1997 | Konishi | G02B 6/4295 | 257/433 |
| 6,303,987 B1 * | 10/2001 | Kawamura | H01L 24/72 | 257/181 |
| 6,445,013 B1 * | 9/2002 | Taguchi | H01L 23/051 | 257/127 |
| 6,759,735 B2 * | 7/2004 | Omura | H01L 23/051 | 257/181 |
| 6,781,227 B2 * | 8/2004 | Merlin | H01L 23/051 | 257/181 |
| 7,943,956 B2 * | 5/2011 | De Doncker | H01L 23/051 | 257/147 |
| 8,456,001 B2 * | 6/2013 | Taguchi | H01L 23/051 | 257/181 |
| 9,177,943 B2 * | 11/2015 | Golland | H01L 25/115 | |
| 2015/0206811 A1 * | 7/2015 | Miyake | H01L 23/051 | 257/683 |

FOREIGN PATENT DOCUMENTS

| | | |
|---|---|---|
| JP | 2014008769 A | 1/2014 |
| JP | 2015138835 A | 7/2015 |

* cited by examiner

SEMICONDUCTOR DEVICE

CROSS REFERENCE TO RELATED APPLICATIONS

This application is based upon and claims the benefit of priority from the prior Japanese Patent Application No. 2014-187951, filed on Sep. 16, 2014, the entire contents of which are incorporated herein by reference.

FIELD

The embodiments of the present invention relate to a semiconductor device.

BACKGROUND

A pressure-contact semiconductor device has a semiconductor chip for switching high currents incorporated therein. Because the semiconductor chip switches high currents, there is a case where air in the semiconductor chip leaks out with heat at a high temperature when the semiconductor chip is damaged. In such a case, not only the semiconductor chip but also peripheral components of the semiconductor chip included in the pressure-contact semiconductor device may be also damaged.

DETAILED DESCRIPTION

Embodiments will now be explained with reference to the accompanying drawings. The present invention is not limited to the embodiments. In the embodiments, "an upper direction" or "a lower direction" refers to a current flowing direction, conveniently. Therefore, the term "upper direction" or "lower direction" occasionally differs from an upper direction or a lower direction based on a gravitational acceleration direction.

A semiconductor device according to an embodiment comprises a semiconductor chip comprising a first terminal surface and a second terminal surface that is opposite to the first terminal surface. An insulator surrounds an outer circumference of a side surface of the semiconductor chip. A reinforcing member is arranged between the side surface of the semiconductor chip and an inner side surface of the insulator and surrounds the outer circumference of the side surface of the semiconductor chip. A first holder and a second holder hold the reinforcing member between the first holder and the second holder at a top surface and a bottom surface, respectively, of the reinforcing member. The first holder and the second holder comprise protrusions, respectively, facing an inner wall surface of the reinforcing member, and the when $\phi1in$ represents an inner diameter of parts of the reinforcing member opposing to the protrusions, $\phi1out$ represents an outer diameter of the reinforcing member, $\phi2$ represents an outer diameter of the protrusion of either the first holder or the second holder, and $\phi3$ represents an inner diameter of the insulator, the following Expression 1 is satisfied $$\phi1in - \phi2 < \phi3 - \phi1out \qquad \text{Expression 1.}$$

First Embodiment

Figure 1:
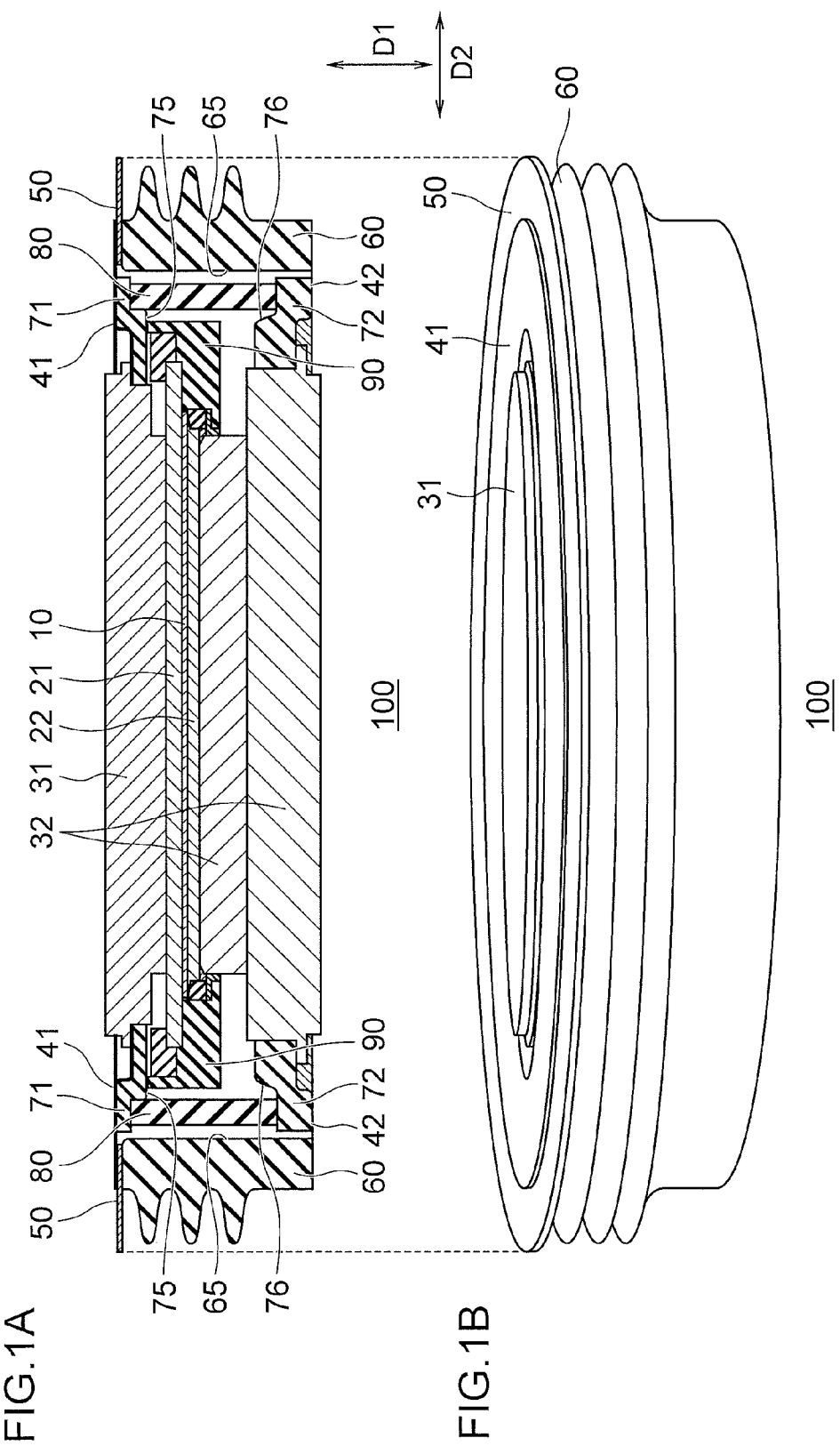
FIGS. 1A and 1B are a cross-sectional view and a perspective view, respectively, illustrating a semiconductor device according to a first embodiment.

FIGS. 1A and 1B are a cross-sectional view and a perspective view, respectively, illustrating a semiconductor device 100 according to a first embodiment. Although not particularly limited thereto, the semiconductor device 100 is, for example, a pressure-contact semiconductor device used in power substation facilities, trains, or the like and is used to switch high currents (larger than 2,000 amperes, for example).

The semiconductor device 100 includes a semiconductor chip 10, buffer units 21 and 22, electrodes 31 and 32, connection units 41 and 42, a sealing unit 50, an outer insulator 60, a first holder 71, a second holder 72, a reinforcing member 80, and an insulation protector 90.

The semiconductor chip 10 is an element that switches currents and includes, for example, a transistor (not shown) formed in a silicon substrate. The top surface and the bottom surface of the semiconductor chip 10 constitute a pair of terminals, causing a current to flow in a direction from the top surface to the bottom surface or from the bottom surface to the top surface. For example, the top surface of the semiconductor chip 10 is a first terminal surface to which a high voltage is applied, and the bottom surface of the semiconductor chip 10 is a second terminal surface that is kept at a ground potential. Descriptions of the gate of the semiconductor chip 10 are omitted here. The ground potential does not represent a reference (0 volt) for the whole circuit but represents a reference potential for the element (a reference for a gate potential).

The buffer unit 21 is arranged on the top surface of the semiconductor chip 10. The buffer unit 22 is arranged on the bottom surface of the semiconductor chip 10. The buffer units 21 and 22 are provided to reduce thermal stresses applied to the semiconductor chip 10 by the electrodes 31 and 32 of the semiconductor device 100 when the electrodes 31 and 32 are pressure-contacted, respectively. For the buffer units 21 and 22, electrically conductive metal such as molybdenum is used to provide electrical connection between the semiconductor chip 10 and the electrodes 31 and 32.

The electrode 31 is arranged on the buffer unit 21. The electrode 32 is arranged under the buffer unit 22. The electrode 31 is electrically connected to the top surface (the first terminal surface) of the semiconductor chip 10 via the buffer unit 21. The electrode 32 is electrically connected to the bottom surface (the second terminal surface) of the semiconductor chip 10 via the buffer unit 22. For the electrodes 31 and 32, electrically conductive metal such as copper is used.

The connection unit 41 is arranged on the periphery of the electrode 31. The connection unit 42 is arranged on the periphery of the electrode 32. The connection unit 41 is provided between the electrode 31 and the sealing unit 50 or the outer insulator 60. The connection unit 42 is provided between the electrode 32 and the outer insulator 60. The connection units 41 and 42 are provided to seal off an internal structure including the semiconductor chip 10 surrounded by the outer insulator 60 while exposing the top and bottom surfaces of the electrodes 31 and 32, respectively, to outside. It is preferable that the connection units 41 and 42 are electrically conductive metal having a high mechanical strength and a high melting point. For example, copper is used for the connection unit 41 and an alloy of iron and nickel is used for the connection unit 42.

The outer insulator 60 is arranged as an insulator between the connection unit 41 and the connection unit 42. The outer insulator 60 is provided to surround the outer circumference of a side surface of the semiconductor chip 10. The outer insulator 60 has a cylindrical shape as shown in FIG. 1B and is made of an insulating material such as ceramics. Together with the connection units 41 and 42, the outer insulator 60 seals off the semiconductor chip 10 and the like. The outer insulator 60 is provided to insulate the connection unit 41 and the connection unit 42 and between the electrode 31 and the electrode 32. The outer insulator 60 is provided also to surround the outer circumference of the side surface of the semiconductor chip 10 and the like to protect internal components such as the semiconductor chip 10.

The reinforcing member 80 is arranged between the insulation protector 90 that covers the side surface of the semiconductor chip 10 and an inner side surface 65 of the outer insulator 60. The reinforcing member 80 surrounds the outer circumference of the side surface of the semiconductor chip 10. The reinforcing member 80 suppresses damages to the outer insulator 60 caused by fragments of the semiconductor chip 10 contacting the outer insulator 60 when the semiconductor chip 10 is damaged. That is, the reinforcing member 80 is provided to protect the outer insulator 60.

The reinforcing member 80 has a substantially cylindrical shape and is held at the top surface and the bottom surface by and between the first holder 71 and the second holder 72, respectively. The reinforcing member 80 is made of an electrically insulating material. For example, any one of the following materials is used for the reinforcing member 80, which are glass fiber reinforced plastic, FRP (fiber reinforced plastic), a glass filler, PTFE (polytetrafluoroethylene), ceramics, silicon nitride, Al2O3, and zirconia. To suppress damages to the outer insulator 60, it is preferable that a material having a higher strength (rigidity) than a material used for the outer insulator 60 is used for the reinforcing member 80. However, a material having a lower strength (rigidity) than that of the outer insulator 60 can be used as long as the reinforcing member 80 can absorb impact and suppress damages to the outer insulator 60.

The first holder 71 and the second holder 72 are provided at the top surface and the bottom surface, respectively, of the reinforcing member 80 to hold the reinforcing member 80 therebetween. That is, the first holder 71 and the second holder 72 hold the reinforcing member 80 by sandwiching the reinforcing member 80 in the vertical direction (a direction D1). While being held by and between the first holder 71 and the second holder 72, the reinforcing member 80 is not bonded with an adhesive or welded to the first holder 71 and the second holder 72. For the first holder 71 and the second holder 72, silicone rubber or the like is used.

The first holder 71 and the second holder 72 include a protrusion 75 and a protrusion 76, respectively, which protrude on an inner wall side of the reinforcing member 80. The protrusions 75 and 76 extend along the inner circumference of the reinforcing member 80. The first holder 71 is in contact with the top surface of the reinforcing member 80 and the protrusion 75 protrudes downward from the upper end of the reinforcing member 80. Accordingly, the protrusion 75 has a facing surface (a side surface F1 in FIG. 2A) that faces an upper inner wall surface of the reinforcing member 80. The second holder 72 is in contact with the bottom surface of the reinforcing member 80 and the protrusion 76 protrudes upward from the lower end of the reinforcing member 80. As a result, the protrusion 76 has a facing surface (a side surface F2 in FIG. 2C) that faces a lower inner wall surface of the reinforcing member 80.

As each of the protrusions 75 and 76 protrudes on the inner wall side of the reinforcing member 80, the reinforcing member 80 is held to some extent in a direction of the outer insulator 60 or a direction of the protrusions 75 and 76 (a direction D2). However, the inner wall surface of the reinforcing member 80 and the protrusions 75 and 76 are not closely attached to each other but there is a space (a clearance) between the inner wall surface of the reinforcing member 80 and the protrusions 75 and 76. As mentioned above, the reinforcing member 80 is not adhered to the first holder 71 and the second holder 72. Therefore, the reinforcing member 80 can be moved (displaced) to some extent in the direction D2 between the first holder 71 and the second holder 72. In this case, the reinforcing member 80 is stopped by contacting the protrusion 75 or 76 before contacting the inner side surface 65 of the outer insulator 60. For example, when the reinforcing member 80 is moved leftward on the drawing of FIG. 1A, the protrusion 75 or 76 on the right side on the drawing of FIG. 1A catches on the reinforcing member 80. As a result, the reinforcing member 80 is not moved leftward any further. Meanwhile, when the reinforcing member 80 is moved rightward on the drawing of FIG. 1A, the protrusion 75 or 76 on the left side on the drawing of FIG. 1A catches on the reinforcing member 80. As a result, the reinforcing member 80 is not moved rightward any further. Therefore, the protrusion 75 or 76 limits movements of the reinforcing member 80 in the direction D2. The movements of the reinforcing member 80 in the direction D2 are explained in detail later.

The insulation protector 90 is arranged on the side surface (the outer edge) of the semiconductor chip 10 and the side surfaces (the outer edges) of the buffer units 21 and 22. The insulation protector 90 is made of an insulating material such as resin. The insulation protector 90 protects the side surface of the semiconductor chip 10 and the side surfaces of the buffer units 21 and 22. Furthermore, the insulation protector 90 reduces short-circuiting between the terminal surface as the top surface of the semiconductor chip 10 and the terminal surface as the bottom surface thereof, short-circuiting between the buffer unit 21 and the buffer unit 22, and short-circuiting between the electrode 31 and the electrode 32.

Figure 2:
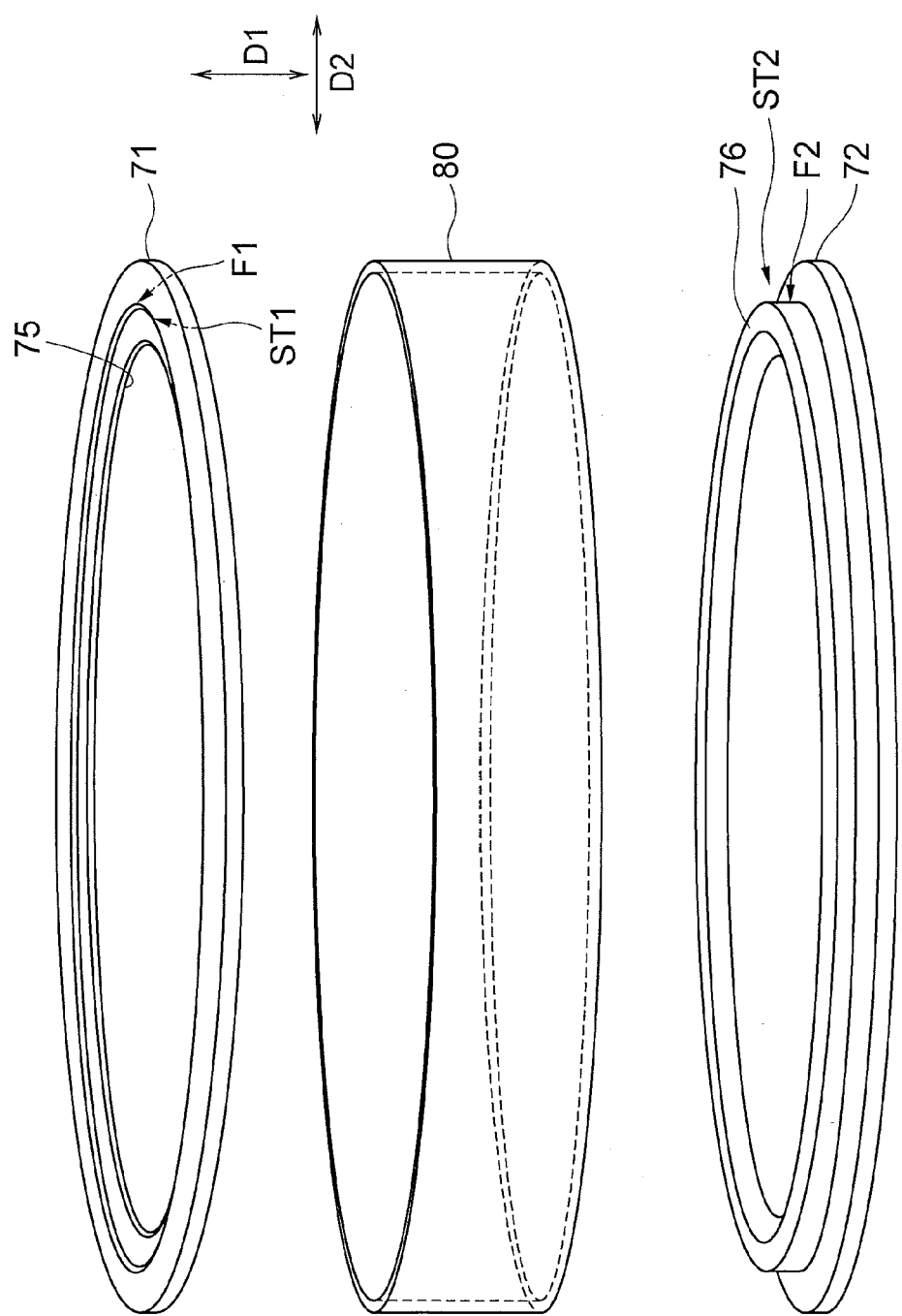
FIGS. 2A to 2C are perspective views illustrating the first holder, the reinforcing member, and the second holder according to the first embodiment.

FIGS. 2A to 2C are perspective views illustrating the first holder 71, the reinforcing member 80, and the second holder 72.

As shown in FIG. 2A, the first holder 71 has a ring shape and includes the protrusion 75. That is, the first holder 71 is formed to include a step ST1 as shown in FIG. 2A. The step ST1 (the protrusion 75) fits onto a top part of the reinforcing member 80, whereby the reinforcing member 80 is held. The side surface F1 of the step ST1 is a facing surface that faces the inner wall surface of the reinforcing member 80.

As shown in FIG. 2C, the second holder 72 has a ring shape and includes the protrusion 76. That is, the second holder 72 is formed to include a step ST2 as shown in FIG. 2C. The step ST2 (the protrusion 76) fits onto a bottom part of the reinforcing member 80, whereby the reinforcing member 80 is held. The side surface F2 of the step ST2 is a facing surface that faces the inner wall surface of the reinforcing member 80. As shown in FIG. 2B, the reinforcing member 80 is formed to include a cylindrical shape. The reinforcing member 80 is held in the direction D1 by and between the first holder 71 and the second holder 72. At this time, the step ST1 (the protrusion 75) and the step ST2 (the protrusion 76) fit onto the reinforcing member 80, whereby the reinforcing member 80 is held. The reinforcing member 80, the first holder 71, and the second holder 72 are arranged to be substantially concentric with the outer insulator 60.

Figure 3:
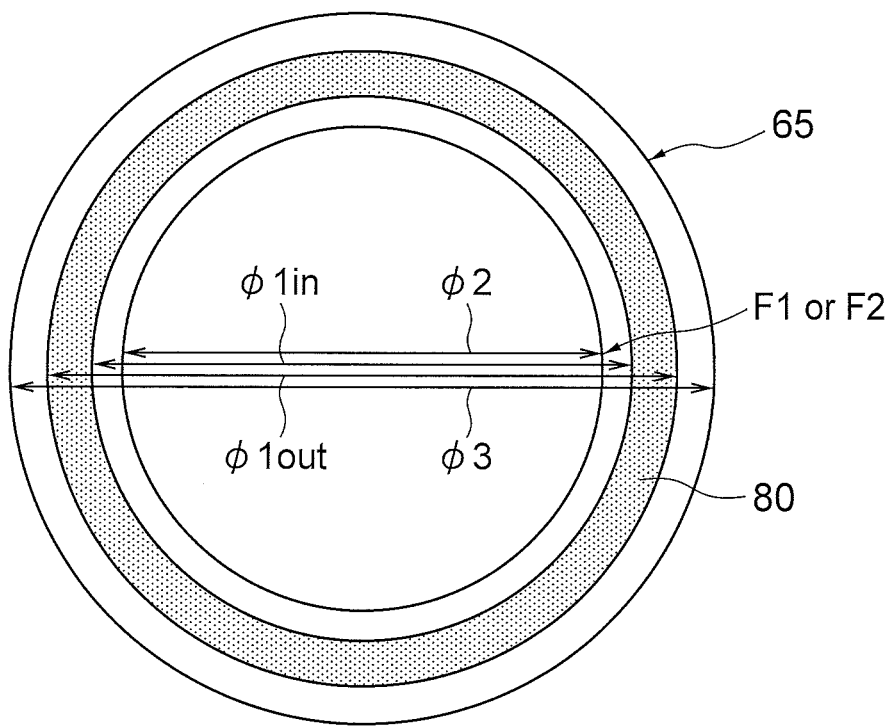
FIG. 3 is a conceptual diagram illustrating respective diameters of the first holder, the second holder, the reinforcing member, and the outer insulator according to the first embodiment.

FIG. 3 is a conceptual diagram illustrating respective diameters of the first holder 71, the second holder 72, the reinforcing member 80, and the outer insulator 60. In FIG. 3, the gap between the first holder 71 or the second holder 72 and the reinforcing member 80 and the gap between the outer insulator 60 and the reinforcing member 80 are shown in a magnified manner to facilitate understanding.

It is assumed here that $\phi 1\text{in}$ represents an inner diameter of the reinforcing member 80, $\phi 1\text{out}$ represents an outer diameter of the reinforcing member 80, $\phi 2$ represents an outer diameter of the protrusion 75 or 76 (a diameter of the side surface F1 of the step ST1 or the side surface F2 of the step ST2), and $\phi 3$ represent an inner diameter of the outer insulator 60 (a diameter of the inner side surface 65). In this case, the first holder 71, the second holder 72, the reinforcing member 80, and the outer insulator 60 are formed to satisfy Expression 1.

$$\phi 1\text{in} - \phi 2 < \phi 3 - \phi 1\text{out} \qquad \text{Expression 1}$$

Expression 1 is explained with reference to FIGS. 4A to 4D. FIGS. 4A to 4D are conceptual diagrams illustrating states when the reinforcing member 80 has moved.

Figure 4A:
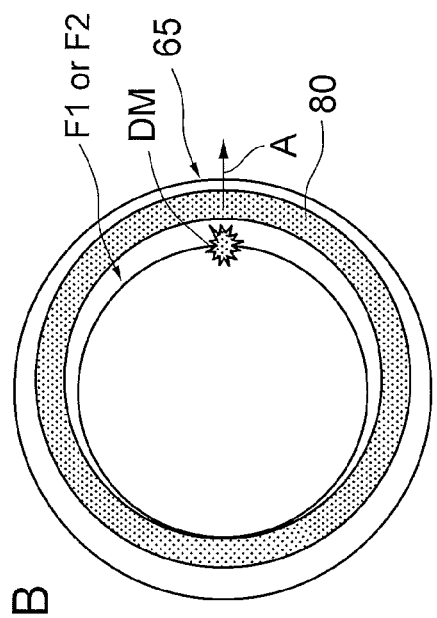
FIGS. 4A to 4D are conceptual diagrams illustrating states when the reinforcing member has moved according to the first embodiment.
Figure 4B:
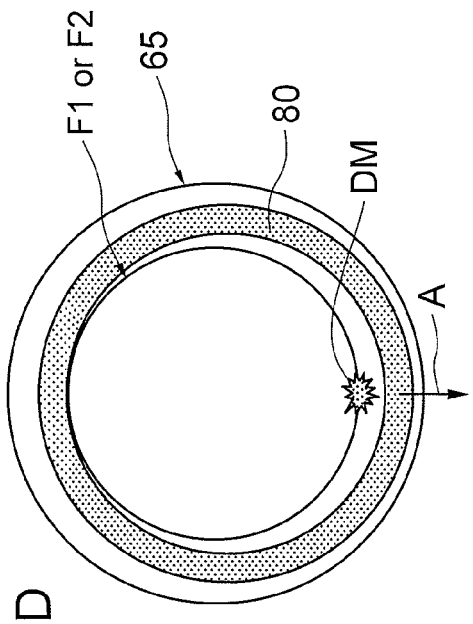
Figure 4C:
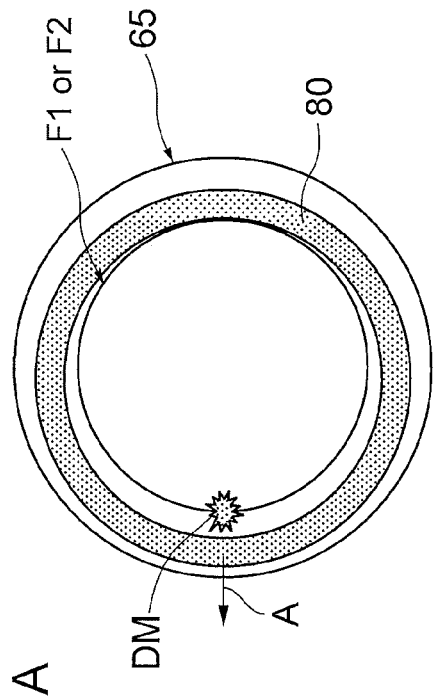
Figure 4D:
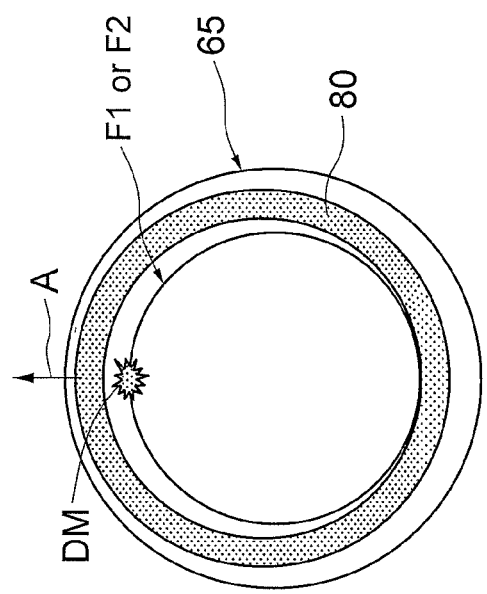

For example, when a part of the semiconductor chip 10 is locally damaged as shown in FIG. 4A, a damage DM causes the reinforcing member 80 to move in the direction of an arrow A. In this example, a difference ($\phi 1\text{in} - \phi 2$) between the inner diameter of parts of the reinforcing member 80 opposing to the protrusions 75, 76 and the outer diameter of the protrusion 75 or 76 is less than a difference ($\phi 3 - \phi 1\text{out}$) between the outer diameter of the reinforcing member 80 and the inner diameter of the outer insulator 60. That is, the gap (for example, several hundred nm to 0.5 mm wide) between the reinforcing member 80 and the protrusion 75 or 76 is smaller than the gap (for example, several mm wide) between the reinforcing member 80 and the outer insulator 60. Therefore, when the reinforcing member 80 is moved, the inner wall surface of the reinforcing member 80 contacts the protrusion 75 or 76 instead of an outer wall surface of the reinforcing member 80 contacting the outer insulator 60. That is, the protrusion 75 or 76 serves as a stopper to limit the movements of the reinforcing member 80. This reduces the possibility that the reinforcing member 80 contacts the outer insulator 60, thereby suppressing damages to the outer insulator 60. As a result, the damage DM can be kept only within the semiconductor device 100. Because the outer insulator 60 is an outermost element of the semiconductor device 100, suppression of damages to the outer insulator 60 leads to an improvement in safety of the semiconductor device 100.

When the reinforcing member 80 is moved, the reinforcing member 80 can contact both of the protrusions 75 and 76 or either the protrusion 75 or 76. That is, both of the diameter of the side surface F1 of the protrusion 75 and the diameter of the side surface F2 of the protrusion 76 can satisfy Expression 1 or one of these diameters can satisfy Expression 1 mentioned above. This is because the movements of the reinforcing member 80 can be limited even by a contact of the reinforcing member 80 with either the protrusion 75 or 76. It is needless to mention that the reinforcing member 80 can contact both of the protrusions 75 and 76. This configuration enables the movements of the reinforcing member 80 to be reliably limited.

The outer insulator 60 and the reinforcing member 80 each have a cylindrical shape and the first holder 71 and the second holder 72 each have a ring shape. The outer insulator 60, the reinforcing member 80, the first holder 71, and the second holder 72 are arranged to be substantially concentric with one another. With this configuration, no matter which direction the reinforcing member 80 is moved in, the first holder 71 or the second holder 72 limits the movements of the reinforcing member 80 as shown in FIGS. 4A to 4D, and accordingly damages to the outer insulator 60 can be suppressed.

As described above, according to the present embodiment, the first holder 71, the reinforcing member 80, and the second holder 72 are formed to satisfy Expression 1 mentioned above, whereby the inner wall surface of the reinforcing member 80 contacts the protrusion 75 or 76 before the outer wall surface of the reinforcing member 80 contacts the outer insulator 60. As the protrusion 75 or 76 limits the movements of the reinforcing member 80 in this way, it becomes possible to suppress damages to the outer insulator 60 and to improve the safety of the semiconductor device 100.

For example, even when the semiconductor device 100 is a semiconductor device that switches high currents, such as a pressure-contact semiconductor device, damages to the outer insulator 60 are reduced. As a result, even when a large amount of energy causes the semiconductor chip 10 to be melted with heat at a high temperature, leakage of the melted parts to outside the outer insulator 60 can be suppressed.

The protrusions 75 and 76 can be provided on the first holder 71 and the second holder 72, intermittently, partially or discretely, as long as the reinforcing member 80 contacts the protrusion 75 or 76 before the reinforcing member 80 contacts the outer insulator 60 even if the reinforcing member 80 moves in any direction.

Second Embodiment

Figures 5A, 5B:
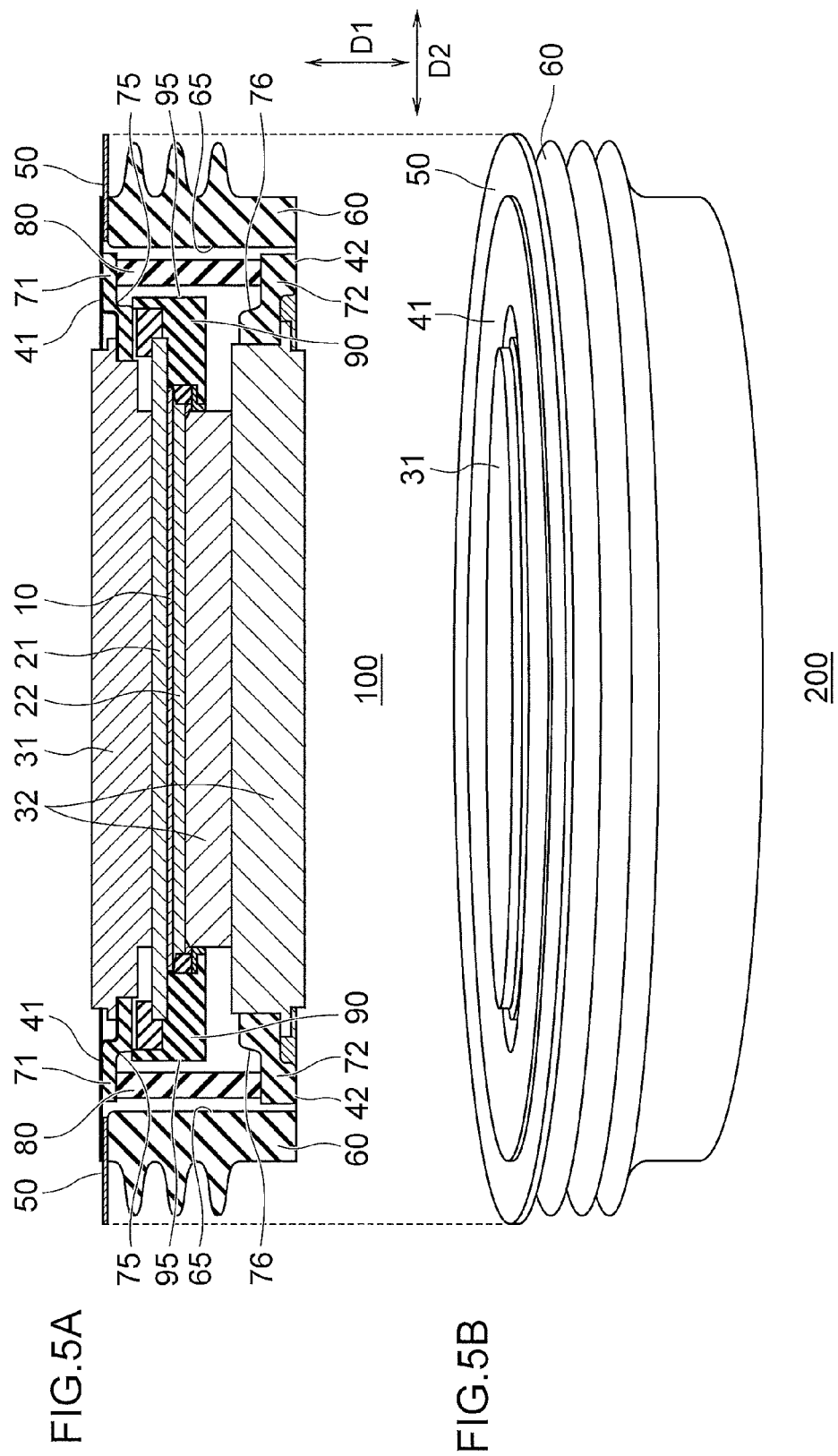
FIGS. 5A and 5B are a cross-sectional view and a perspective view, respectively, illustrating a semiconductor device according to a second embodiment.

FIGS. 5A and 5B are a cross-sectional view and a perspective view, respectively, illustrating a semiconductor device 200 according to a second embodiment. In the semiconductor device 200, an outer side surface 95 of the insulation protector 90 is closer to the reinforcing member 80 than the protrusion 75 of the first holder 71 and the protrusion 76 of the second holder 72. Therefore, when the reinforcing member 80 is moved, the inner wall surface of the reinforcing member 80 contacts the outer side surface 95 of the insulation protector 90. In the second embodiment, the insulation protector 90 thus functions as a stopper for the reinforcing member 80, thereby limiting the movements of the reinforcing member 80. Other configurations of the second embodiment can be identical to the corresponding configurations of the first embodiment.

Figure 6:
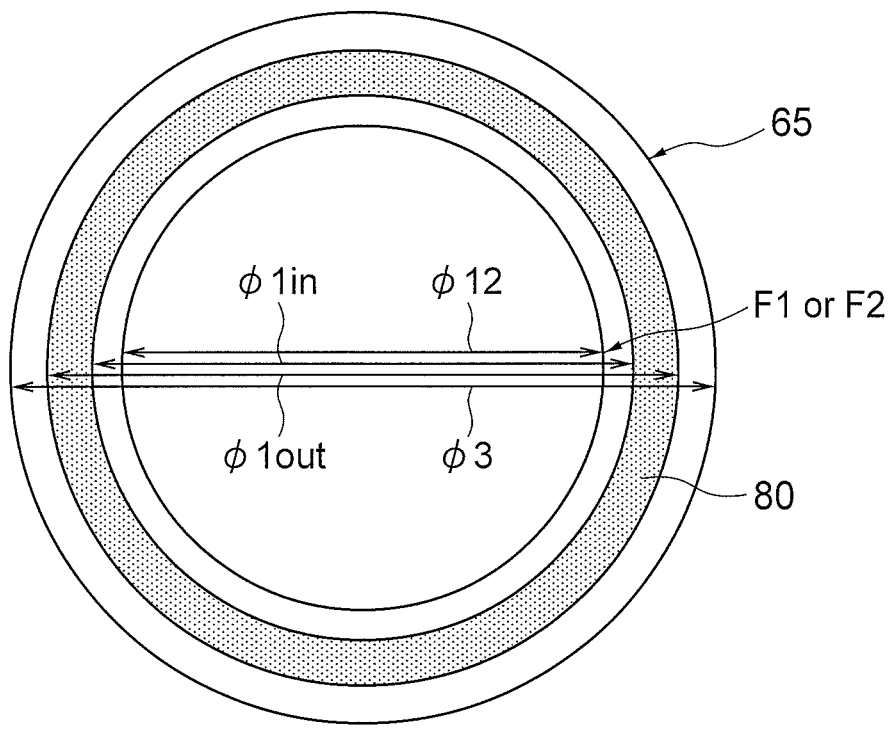
FIG. 6 is a conceptual diagram illustrating respective diameters of the insulation protector, the reinforcing member, and the outer insulator according to the second embodiment.

FIG. 6 is a conceptual diagram illustrating respective diameters of the insulation protector 90, the reinforcing member 80, and the outer insulator 60. The insulation protector 90, the reinforcing member 80, and the outer insulator 60 are formed to satisfy the following Expression 2 where $\phi 12$ represents an outer diameter of the insulation protector 90 (a diameter of the outer side surface 95).

$$\phi 1\text{in} - \phi 12 < \phi 3 - \phi 1\text{out} \qquad \text{Expression 2}$$

For example, as explained with reference to FIG. 4A, when a part of the semiconductor chip 10 is locally damaged, the damage DM causes the reinforcing member 80 to move in the direction of the arrow A. A difference ($\phi 1\text{in} - \phi 12$) between the inner diameter of parts of the reinforcing member 80 opposing to the outer side surface 95 and the outer diameter of the insulation protector 90 is less than a difference (φ3−φ1out) between the outer diameter of the reinforcing member 80 and the inner diameter of the outer insulator 60. That is, the gap between the reinforcing member 80 and the insulation protector 90 is less than the gap between the reinforcing member 80 and the outer insulator 60. Therefore, when the reinforcing member 80 is moved, the inner wall surface of the reinforcing member 80 contacts the outer side surface 95 of the insulation protector 90 instead of the outer wall surface of the reinforcing member 80 contacting the outer insulator 60. That is, the insulation protector 90 serves as a stopper to catch on the reinforcing member 80 and limit the movements of the reinforcing member 80. This reduces the possibility that the reinforcing member 80 contacts the outer insulator 60, causing suppression of damages to the outer insulator 60. As a result, the second embodiment can achieve effects identical to those in the first embodiment.

The insulation protector 90 is arranged over the entire outer circumference of the semiconductor chip 10. With this configuration, no matter which direction the reinforcing member 80 is moved in, the insulation protector 90 limits the movements of the reinforcing member 80 and accordingly damages to the outer insulator 60 can be reduced.

On the contrary, the insulation protector 90 can be provided on the outer circumference of the semiconductor chip 10, intermittently, partially or discretely, as long as the reinforcing member 80 contacts the insulation protector 90 before the reinforcing member 80 contacts the outer insulator 60 even if the reinforcing member 80 moves in any direction.

In the embodiments described above, the plane views of the outer insulator 60, the reinforcing member 80, the first holder 71 and the second holder 72 and the insulation protector 90 may have a shape of an ellipse or a polygon, as long as they can suffice the conditions described above (e.g. Expression 1 or 2).

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
a semiconductor chip including a first terminal surface and a second terminal surface that is opposite to the first terminal surface;
an insulator surrounding an outer circumference of a side surface of the semiconductor chip;
a reinforcing member arranged between the side surface of the semiconductor chip and an inner side surface of the insulator and surrounding the outer circumference of the side surface of the semiconductor chip; and
a first holder and a second holder holding the reinforcing member between the first holder and the second holder at a top surface and a bottom surface, respectively, of the reinforcing member, wherein
the first holder and the second holder comprise protrusions, respectively, facing an inner wall surface of the reinforcing member, and when φ1in represents an inner diameter of a part of the reinforcing member opposing to the protrusions, φ1out represents an outer diameter of the reinforcing member, φ2 represents an outer diameter of the protrusion of either the first holder or the second holder, and φ3 represents an inner diameter of the insulator, Expression 1 is satisfied $$\phi 1in - \phi 2 < \phi 3 - \phi 1out \qquad \text{Expression 1.}$$

2. The device of claim 1, wherein the inner wall surface of the reinforcing member contacts the protrusions instead of an outer wall surface of the reinforcing member contacting the insulator when the reinforcing member is moved toward either the insulator or the protrusions.

3. The device of claim 1, wherein movements of the reinforcing member are limited by the protrusions when the reinforcing member is moved toward either the insulator or the protrusions.

4. The device of claim 2, wherein movements of the reinforcing member are limited by the protrusions when the reinforcing member is moved toward either the insulator or the protrusions.

5. The device of claim 1, wherein
the reinforcing member has a substantially cylindrical shape, and
the first holder and the second holder have ring shapes, respectively.

6. The device of claim 2, wherein
the reinforcing member has a substantially cylindrical shape, and
the first holder and the second holder have ring shapes, respectively.

7. The device of claim 3, wherein
the reinforcing member has a substantially cylindrical shape, and
the first holder and the second holder have ring shapes, respectively.

8. The device of claim 1, wherein the reinforcing member is made of an electrically insulating material.

9. The device of claim 1, wherein the reinforcing member is made of any one of glass fiber reinforced plastic, FRP, a glass filler, PTFE, ceramics, silicon nitride, Al2O3, and zirconia.

10. A semiconductor device comprising:
a semiconductor chip comprising a first terminal surface and a second terminal surface that is opposite to the first terminal surface;
an insulator surrounding an outer circumference of a side surface of the semiconductor chip;
an insulation protector arranged on the side surface of the semiconductor chip and providing electrical insulation between the first terminal surface and the second terminal surface; and
a reinforcing member arranged between the insulation protector and an inner side surface of the insulator and surrounding the outer circumference of the side surface of the semiconductor chip, wherein
when φ1in represents an inner diameter of a part of the reinforcing member opposing to the insulation protector, φ1out represents an outer diameter of the reinforcing member, φ12 represents an outer diameter of the insulation protector, and φ3 represents an inner diameter of the insulator, Expression 2 is satisfied $$\phi 1in - \phi 12 < \phi 3 - \phi 1out \qquad \text{Expression 2.}$$

11. The device of claim 10, wherein an inner wall surface of the reinforcing member contacts the insulation protector instead of an outer wall surface of the reinforcing member contacting the insulator when the reinforcing member is moved toward either the insulator or the insulation protector.

12. The device of claim 10, wherein movements of the reinforcing member are limited by the insulation protector when the reinforcing member is moved toward either the insulator or the insulation protector.

13. The device of claim 11, wherein movements of the reinforcing member are limited by the insulation protector when the reinforcing member is moved toward either the insulator or the insulation protector.

14. The device of claim 10, wherein the reinforcing member has a substantially cylindrical shape.

15. The device of claim 11, wherein the reinforcing member has a substantially cylindrical shape.

16. The device of claim 12, wherein the reinforcing member has a substantially cylindrical shape.

17. The device of claim 10, wherein the reinforcing member is made of an electrically insulating material.

18. The device of claim 10, wherein the reinforcing member is made of any one of glass fiber reinforced plastic, FRP, a glass filler, PTFE, and ceramics.

* * * * *